(12) United States Patent
Masuda (10) Patent No.: US 7,952,117 B2
(45) Date of Patent: May 31, 2011

(54) FIELD-EFFECT TRANSISTOR

(75) Inventor: Satoshi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 62 days.

(21) Appl. No.: 12/192,187

(22) Filed: Aug. 15, 2008

(65) Prior Publication Data

US 2009/0050900 A1 Feb. 26, 2009

(30) Foreign Application Priority Data

Aug. 23, 2007 (JP) ................................. 2007-217254

(51) Int. Cl.
*H01L 29/267* (2006.01)
(52) U.S. Cl. .......... 257/192; 257/77; 257/202; 257/401; 257/E29.127; 257/E29.317
(58) Field of Classification Search .................... 257/77, 257/192, 202, 401
See application file for complete search history.

(56) References Cited

U.S. PATENT DOCUMENTS

| | | | | |
|---|---|---|---|---|
| 5,397,911 | A * | 3/1995 | Hiyama et al. | 257/415 |
| 5,818,077 | A * | 10/1998 | Takahashi et al. | 257/276 |
| 6,326,651 | B1 * | 12/2001 | Manabe | 257/209 |
| 6,392,278 | B1 * | 5/2002 | Kimura | 257/401 |
| 6,639,255 | B2 | 10/2003 | Inoue et al. | |
| 6,812,505 | B2 | 11/2004 | Inoue et al. | |
| 6,924,516 | B2 | 8/2005 | Inoue et al. | |
| 2002/0140007 | A1 * | 10/2002 | Sakamoto | 257/276 |
| 2005/0023555 | A1 * | 2/2005 | Yoshida et al. | 257/192 |
| 2006/0022218 | A1 * | 2/2006 | Masumoto et al. | 257/192 |
| 2007/0228424 | A1 * | 10/2007 | Igarashi | 257/256 |
| 2008/0237713 | A1 * | 10/2008 | Doumae | 257/347 |
| 2009/0315037 | A1 * | 12/2009 | Kikkawa | 257/76 |

FOREIGN PATENT DOCUMENTS

| | | | |
|---|---|---|---|
| JP | 02278820 | A | 11/1990 |
| JP | 4-115555 | A | 4/1992 |
| JP | 4-302149 | A | 10/1992 |
| JP | 07142512 | A | 6/1995 |
| JP | 10-284508 | A | 10/1998 |
| JP | 2001-230407 | A | 8/2001 |
| JP | 2002299443 | A | 10/2002 |
| JP | 2004103819 | A | 4/2004 |
| JP | 2007-115894 | A | 10/2007 |

OTHER PUBLICATIONS

Japanese Office Action dated Aug. 25, 2009, issued in corresponding Japanese Patent Application No. 2007-217254.
German Office Action dated Feb. 23, 2010, issued in corresponding German Patent Application No. 10 2008 033234.8-33.
Japanese Office Action dated Apr. 6, 2010, issued in corresponding Japanese Patent Application No. 2007-217254.

* cited by examiner

*Primary Examiner* — A. Sefer
(74) *Attorney, Agent, or Firm* — Westerman, Hattori, Daniels & Adrian, LLP

(57) ABSTRACT

At least two drain ohmic contacts are arranged to intersect with an active area. A source ohmic contact is arranged between the drain ohmic contacts. A drain coupling portion on an element separating area couples ends of the drain ohmic contacts on the same side thereof. A gate power supply wiring on the element separating area couples gate fingers at the end thereof on the opposite side of the arrangement side of the drain coupling portion. A gate edge coupling portion couples two gate fingers adjacent to each other, sandwiching the source ohmic contact at the end thereof on the arrangement side of the drain coupling portion. The gate edge coupling portion does not intersect with the drain ohmic contact and the drain coupling portion.

2 Claims, 14 Drawing Sheets

FIELD-EFFECT TRANSISTOR

TECHNICAL FIELD

This is related to a field-effect transistor having a plurality of gate fingers.

BACKGROUND

Figure 10A:
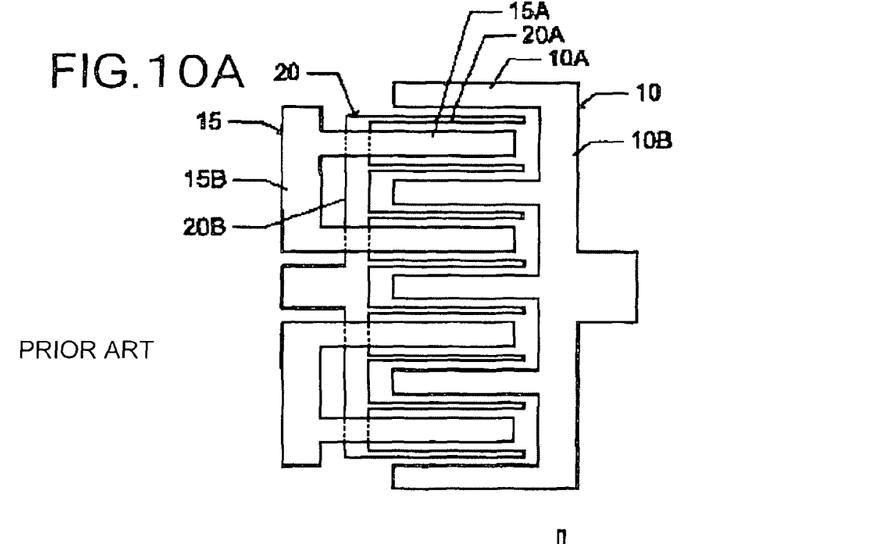
FIGS. 10A to 10C are plan views showing a conventional field-effect transistor.

FIG. 10A shows a schematic plan view showing a field-effect transistor disclosed in Japanese laid-open patent publication No. 2007-115894. Comb-shaped drain 10 and source 15 are arranged to be engaged with each other. The drain 10 includes a plurality of drain ohmic contacts 10A, and a drain coupling portion 10B for mutually coupling first ends (right ends in FIG. 10A) of the plurality of drain ohmic contact contacts 10A. Similarly, the source 15 includes a plurality of source ohmic contacts 15A, and a source coupling portion 15B for mutually coupling first ends (left ends in FIG. 10A) of the plurality of source ohmic contacts 15A.

A plurality of gate fingers 20A are arranged to regions between the drain ohmic contacts 10A and the source ohmic contacts 15A. A gate power supply wiring 20B couples first ends (left ends in FIG. 10A) of the plurality of gate fingers 20A. The gate power supply line 20B intersects with the source 15. Both the gate power supply wiring 20B and the source 15 are insulated at the intersection portion therebetween.

A gate width of the transistor (gate finger length) is increased or the number of gate fingers is increased, thereby outputting high data.

A transistor having a gate finger is formed onto a semiconductor substrate having a crystal default of a micro pipe. Then, at the intersection position between the gate finger and the micro pipe, the gate finger is easily uncoupled. In particular, upon using a single-crystal SiC substrate on which the micro pipe is easily caused, the probability for uncoupling the gate finger is high. When the gate finger is uncoupled, the amount of current per gate width is varied, thereby reducing the yield. Particularly, the number of gate fingers for high output is increased. Then, the probability for uncoupling the gate finger is increased and the yield is dramatically reduced.

Figure 10B:
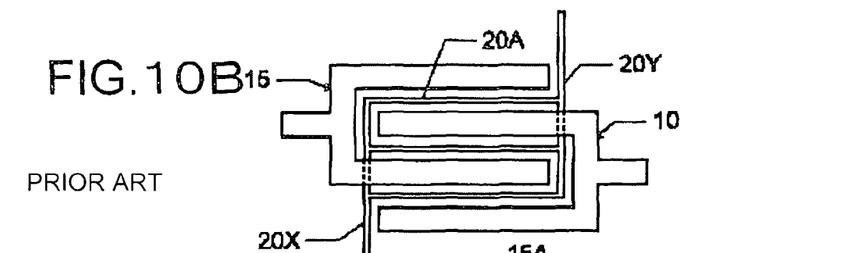

FIG. 10B shows a plan view showing a microwave switch element shown in Japanese laid-open patent publication No. 10-284508. The drain 10 having two ohmic contacts is engaged with the source 15 having two ohmic contacts. The gate fingers 20A are arranged one by one between the ohmic contact of the drain 10 and the ohmic contact of the source 15. That is, the total number of gate fingers 20A is three.

A first gate power supply line 20X couples first ends of three gate fingers 20A, and a second gate power supply line 20Y couples second ends of the three gate fingers 20A. The first gate power supply line 20X intersects with the source 15, and the second gate power supply line 20Y intersects with the drain 10. The gate finer 20A, the source 15, the drain 10, the first gate power supply line 20X, and the second gate power supply line 20Y are arranged to be point-symmetrical to each other. The arrangement obtains a microwave switch element having symmetrical switching characteristics.

Figure 10C:
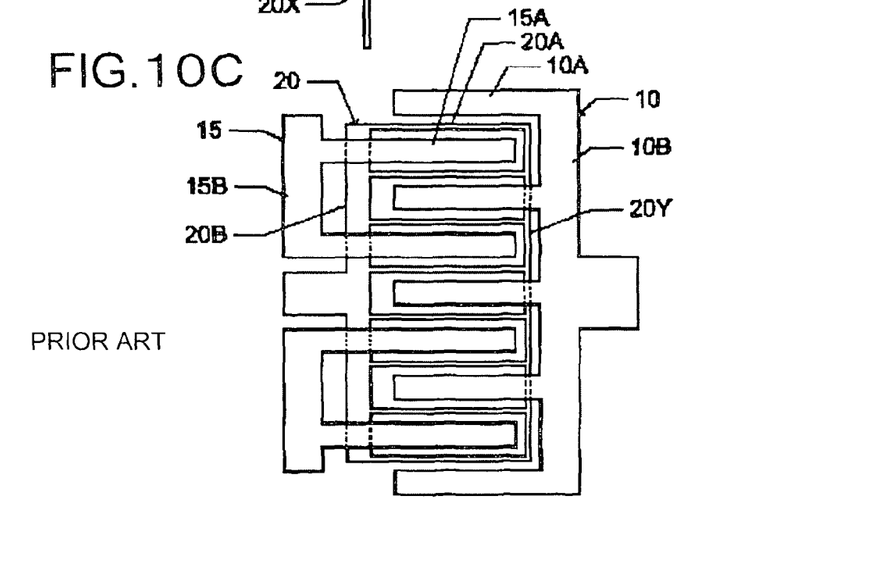

FIG. 10C shows a planar pattern upon applying the gate finger coupling structure shown in FIG. 10B to the field-effect transistor shown in FIG. 10A. One end (right end in FIG. 10C) of the drain coupling portions 10B in the gate fingers 20A is coupled to the second gate power supply lines 20Y. The gate power supply wiring 20B corresponds to the first gate power supply line 20X. The second gate power supply line 20Y intersects with the drain 10.

With the structure shown in FIG. 10C, even if one gate finger 20A is uncoupled at one portion thereof, a gate voltage is applied to a portion on the drain 10 side, rather than the uncoupling portion, via the second gate power supply line 20Y. Therefore, desired transistor characteristics can be maintained.

In the field-effect transistor shown in FIG. 10C, the gate power supply line 20Y intersects with the drain. Therefore, the number of parasitic capacitance between the gate and the drain is increased and preferable high-frequency characteristics cannot be maintained.

SUMMARY OF THE INVENTION

According to one aspect of embodiments, a field-effect transistor that is described bellow is provided. the field-effect transistor includes a semiconductor substrate, at least two drain ohmic contacts, a source ohmic contact, a drain coupling portion, a gate finger, a gate power supply line and a gate edge coupling portion.

A semiconductor substrate have an active area and an element separating area surrounding the active area that are determined on a surface portion of the semiconductor substrate.

At least two drain ohmic contacts is arranged to intersect with the active area on the semiconductor substrate.

A source ohmic contact is arranged to intersect with the active area on the semiconductor substrate between two drain ohmic contacts adjacent thereto.

A drain coupling portion is arranged on the element separating area of the semiconductor substrate and couples ends of the drain ohmic contacts on the same side thereof.

A gate finger is arranged to intersect with the active area on the semiconductor substrate of areas between the drain ohmic contact and the source ohmic contact.

A gate power supply line is arranged on the element separating area of the semiconductor substrate, couples the gate fingers at ends thereof opposite to the arrangement side of the drain coupling portion, and supplies a gate voltage to the gate finer.

A gate edge coupling portion couples two gate fingers adjacent to each other sandwiching the source ohmic contact at an end thereof on the arrangement side of the drain coupling portion and is arranged so as not to intersect with the drain ohmic contact and the drain coupling portion.

DESCRIPTION OF THE PREFERRED EMBODIMENTS

Figure 1:
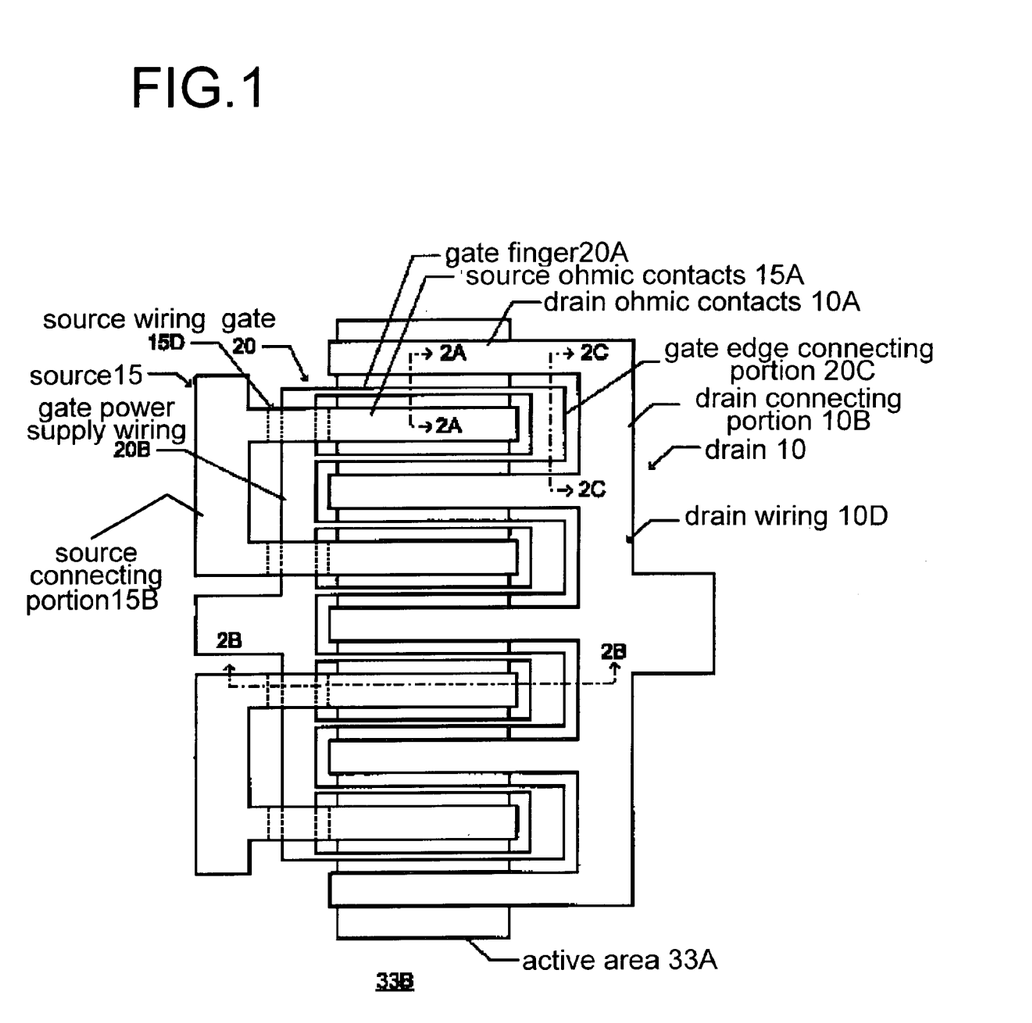
FIG. 1 is a plan view showing a field-effect transistor according to the first embodiment.

FIG. 1 is a plan view showing a field-effect transistor according to the first embodiment. An active area 33A is determined to a surface portion of a semiconductor substrate. An element separating area 33B surrounds the active area 33A. Further, a drain 10, a source 15, and a gate 20 are formed onto a surface of the semiconductor substrate.

The drain 10 includes a plurality of (e.g., five) drain ohmic contacts 10A, a drain coupling portion 10B, and a drain wiring 10D. The drain ohmic contacts 10A intersect with active area 33A, and the plurality of drain ohmic contacts 10A are arranged in parallel with each other at a constant interval. The drain coupling portion 10B is arranged on the element separating area 33B, and couples ends of the plurality of ohmic contacts 10A on the same side thereof. The drain wiring 10D is arranged to be overlapped to the drain ohmic contacts 10A and the drain coupling portion 10B. The drain ohmic contact 10A and the drain coupling portion 10B are integrally formed with the same conductive film.

The source 15 comprises: a plurality of source ohmic contacts 15A; a source coupling portion 15B; and a source wiring 15D. One transistor has two source ohmic contacts 15A.

The source ohmic contact 15A is arranged between the drain ohmic contacts 10A. The source ohmic contacts 15A intersect with the active areas 33A. The source coupling portion 15B is arranged on the element separating area 33B on the opposite side of the drain coupling portion 10B, sandwiching the active area 33A, and is isolated from the source ohmic contacts 15A. The source wiring 15D is arranged to be overlapped to the source ohmic contact 15A and the source coupling portion 15B, and couples the source ohmic contacts 15A to the source coupling portion 15B.

Referring to FIG. 1, two field-effect transistors with two source ohmic contacts 15A are shown. Incidentally, one field-effect transistor may include two drain ohmic contacts 10A and one source ohmic contact 15A. Alternatively, one field-effect transistor may include three or more source ohmic contacts and four or more drain ohmic contacts.

The gate 20 comprises: a gate finger 20A; a gate power supply wiring 20B; and a gate edge coupling portion 20C. One gate finger 20A is arranged between the drain ohmic contact 10A and the source ohmic contact 15A. The gate fingers 20A intersect with the active area 33A. The gate power supply wiring 20B is arranged between the source ohmic contact 15A and the source coupling portion 15B, and mutually couples ends of a plurality of gate fingers 20A on the side of the source coupling portion 15B. The gate power supply wiring 20B intersects with the source wiring 15D. At the intersection portion between the gate power feed wiring 20B and the source wiring 15D, the gate power supply wiring 20B is insulated from the source wiring 15D.

The gate edge coupling portion 20C is arranged on the element separating area 33B, and couples ends of two gate fingers 20A adjacent to each other on the side of the drain coupling portion 10B, sandwiching the source ohmic contact 15A. The gate edge coupling portion 20C is arranged so as not to be overlapped to the drain ohmic contacts 10A and the drain coupling portion 10B.

Figure 2A:
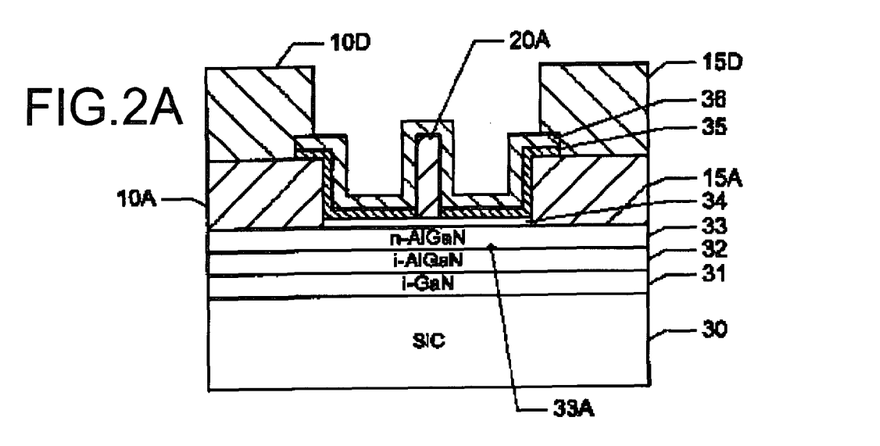
FIGS. 2A to 2C are cross-sectional views showing the field-effect transistor according to the first embodiment.
Figure 2B:
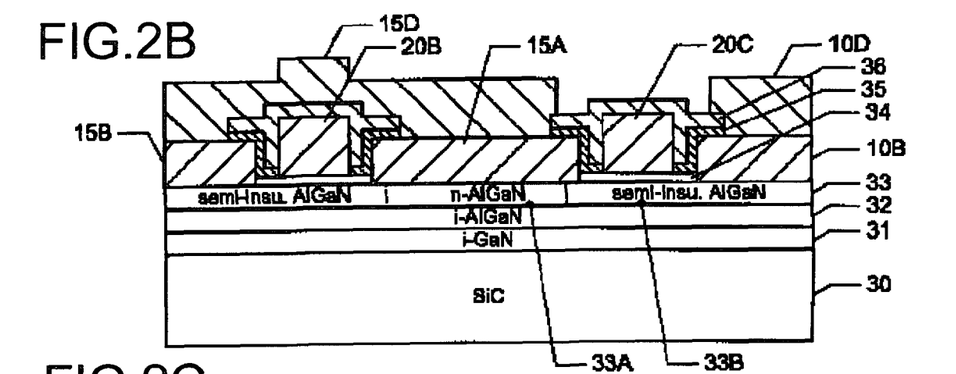
Figure 2C:
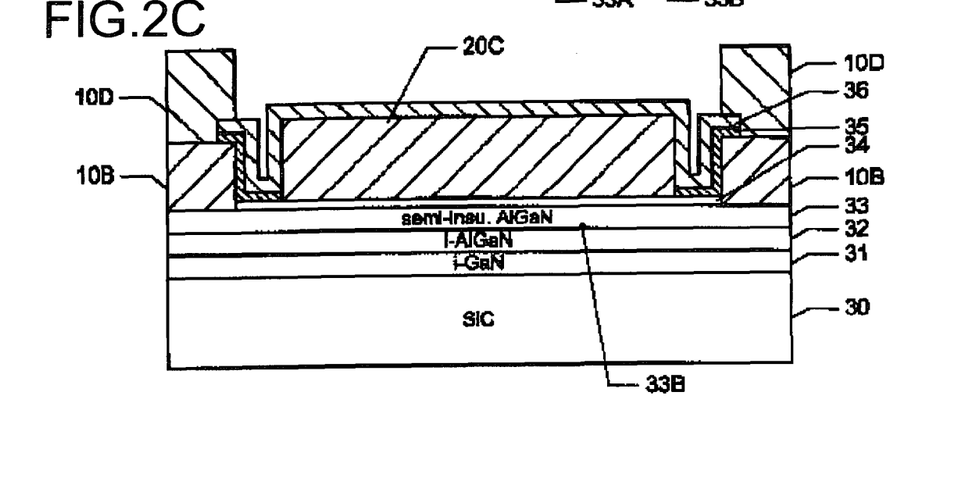

FIGS. 2A to 2C are cross-sectional views of one-dotted broken lines 2A-2A, 2B-2B, and 2C-2C shown in FIG. 1.

Referring to FIG. 2A, a channel layer 31 containing undoped GaN and an intermediate layer 32 containing undoped AlGaN are formed on a bottom substrate 30 containing SiC. An electron supply layer 33 containing AlGaN is arranged on the intermediate layer 32. The n-conductivity is applied to the electron supply layer 33 in the active area 33A.

The drain ohmic contact 10A and the source ohmic contact 15A are arranged on the electron supply layer 33 with an interval. The surface of the electron supply layer 33 between the drain ohmic contact 10A and the source ohmic contact 15A is covered with a surface layer 34 containing n-type GaN. The gate finger 20A is formed on the surface layer 34 apart from both the drain ohmic contact 10A and the source ohmic contact 15A with intervals thereof. The drain ohmic contact 10A and the source ohmic contact 15A have a two-layered structure formed by sequentially laminating a Ta film and an Al film. The gate finger 20A has a two-layered structure formed by sequentially laminating an Ni film and an Au film.

The drain ohmic contact 10A and the source ohmic contact 15A are ohmically coupled to the channel layer 31 via the electron supply layer 33 and the intermediate layer 32 just therebelow. The gate finger 20A comes into contact with the surface layer 34 with shot key, and controls the potential of the channel layer 31 just therebelow.

A first protecting film 35 containing SiN is formed between the source ohmic contact 15A and the gate finger 20A, on the surface layer 34 between the drain ohmic contact 10A and the gate finger 15A, and on the source ohmic contact 15A and the drain ohmic contact 10A. A second protecting film 36 containing SiN is formed on the first protecting film 35 and the surface of the gate finger 20A. Openings for exposing the top surfaces of the drain ohmic contact 10A and the source ohmic contact 15A are formed to the first protecting film 35 and the second protecting film 36. The drain wiring 10D is arranged on the drain ohmic contact 10A, and the source wiring 15D is arranged on the source ohmic contact 15A. The drain wiring 10D and the source wiring 15D are ohmically coupled to the drain ohmic contact 10A and the source ohmic contact 15A via the openings formed to the first protecting film 35 and the second protecting film 36. The drain wiring 10D and the source wiring 15D contain Au.

Referring to FIG. 2B, the electron supply layer 33 in an area surrounding the active area 33A is set as a semi-insulating element separating area 33B. The drain coupling portion 10B, the source ohmic contact 15A, and the source coupling portion 15B are arranged on the electron supply layer 33. The drain coupling portion 10B is arranged on the element separating area 33B on one side (right in FIG. 2B) of the active area 33A, and the source coupling portion 15B is arranged on the element separating area 33B on the other side (left in FIG. 2B). The source ohmic contact 15A is extended from one end to the other end of the active area 33A.

The drain coupling portion 10B, the source ohmic contact 15A, and the source coupling portion 15B are formed by patterning the same conductive film. The source coupling portion 15B is isolated from the source ohmic contact 15A with an interval. The surface of the electron supply layer 33 between the source coupling portion 15B and the source ohmic contact 15A is covered with the surface layer 34. The gate power supply wiring 20B is arranged on the surface layer 34.

The surface of the electron supply layer 33 between the source ohmic contact 15A and the drain coupling portion 10B is covered with the surface layer 34. The gate edge coupling portion 20C is arranged on the surface layer 34. The gate power supply wiring 20B and the gate edge coupling portion 20C are formed simultaneously with the gate finger 20A.

An area without arranging the gate power supply wiring 20B and the gate edge coupling portion 20C on the surface of the surface layer 34 is covered with the first protecting film 35. The first protecting film 35 is extended to the drain coupling portion 10B and the source ohmic contact 15A adjacent to the surface layer 34, and a part of the top surface of the source coupling portion 15B. The second protecting film 36 is formed on the gate power supply wiring 20B, the gate edge coupling portion 20C, and the first protecting film 35. Openings for exposing the top surfaces of the drain coupling portion 10B, the source ohmic contact 15A, and the source coupling portion 15B are formed to the first protecting film 35 and the second protecting film 36. The opening for exposing the top surface of the drain coupling portion 10B is continuous to the opening arranged on the drain ohmic contact 10A shown in FIG. 2A.

The drain wiring 10D is formed on the drain coupling portion 10B. The drain wiring 10D is continuous to the drain wiring 10D on the drain ohmic contact 10A shown in FIG. 2A.

The source wiring 15D is arranged on the source ohmic contact 15A. The source wiring 15D passes through the gate power supply wiring 20B, is extended to the source coupling portion 15B, and electrically couples the source ohmic contact 15A to the source coupling portion 15B. At the intersection position between the source wiring 15D and the gate power supply wiring 20B, both the source wiring 15D and the gate power supply wiring 20B are electrically insulated by the second protecting film 36.

Referring to FIG. 2C, two drain coupling portions 10B are arranged on the element separating area 33B of the electron supply layer 33 with an interval. As shown in FIG. 1, the two drain coupling portions 10B are coupled at the position greatly apart from the active area 33A. The surface of the electron supply layer 33 between the drain coupling portions 10B is covered with the surface layer 34. The gate edge coupling portion 20C is arranged on the surface layer 34. An area without arranging the gate edge coupling portion 20C of the surface of the surface layer 34 is covered with the first protecting film 35. The first protecting film 35 is extended to a part of the top surface of the drain coupling portion 10B adjacent to the surface layer 34.

The second protecting film 36 is formed on the gate edge coupling portion 20C and the first protecting film 35. Openings for exposing the top surface of the drain coupling portion 10B are formed to the first protecting film 35 and the second protecting film 36. The drain wiring 10D is arranged on the drain coupling portion 10B. The drain wiring 10D is continuous to the drain wiring 10D on the drain ohmic contact 10A shown in FIG. 2A.

Next, a description will be given of a method for manufacturing the field-effect transistor according to the first embodiment with reference to FIGS. 3A to 3I. FIGS. 3A to 3I are cross-sectional views of a one-dotted broken line shown in FIG. 1.

Figure 3A:
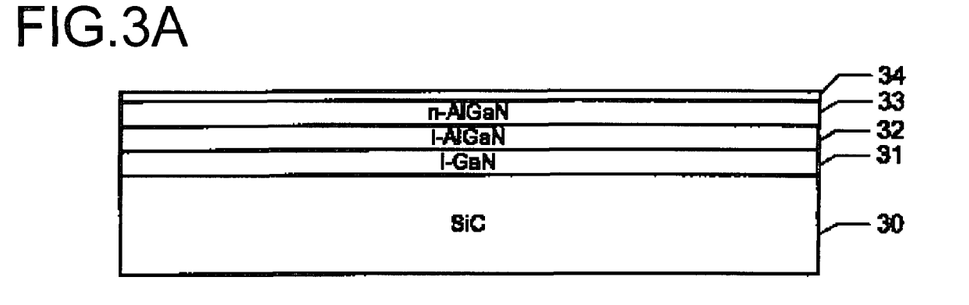
FIGS. 3A to 3C are cross-sectional views showing one step of manufacturing the field-effect transistor according to the first embodiment.

Referring to FIG. 3A, the channel layer 31 with a thickness of 3000 nm containing undoped GaN, the intermediate layer 32 with a thickness of 2 nm containing undoped AlGaN, the electron supply layer 33 with a thickness of 25 nm containing n-type AlGaN, and the surface layer 34 with a thickness of 5 nm containing n-type GaN are sequentially deposited on the substrate 30 containing SiC. The layers are formed by epitaxially growing with MOVPE.

Figure 3B:
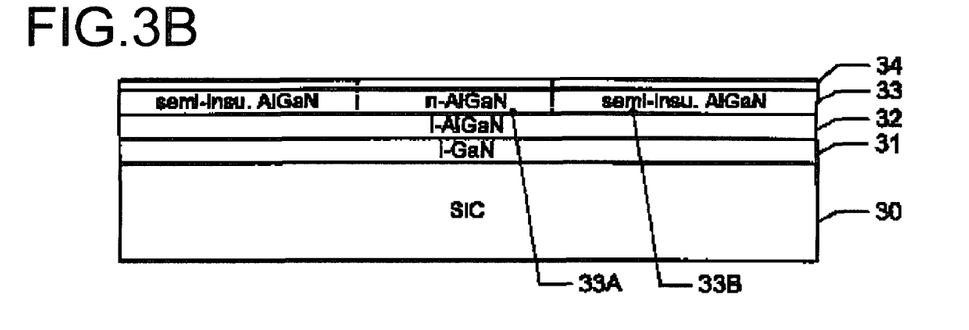

Referring to FIG. 3B, He, $N_2$, C, and Zn are doped to the electron supply layer 33 and the surface layer 34 in the element separating area 33B. The elements are doped, thereby enabling the electron supply layer 33 and the surface layer 34 in the element separating area 33B to be in the semi-insulating state. In place of the semi-insulating state, the intermediate layer 32, the electron supply layer 33, and the surface layer 34 in the element separating area 33B may be etched, thereby exposing the surface of the channel layer 31. The intermediate layer 32, the electron supply layer 33, and the surface layer 34 are etched by reactive ion etching (RIE) using chlorine-system gas such as $Cl_2$, $BCl_3$, or $SiCl_4$. Accordingly, the electron supply layer 33 surrounded by the semi-insulating element separating area 33B is determined.

Figure 3C:
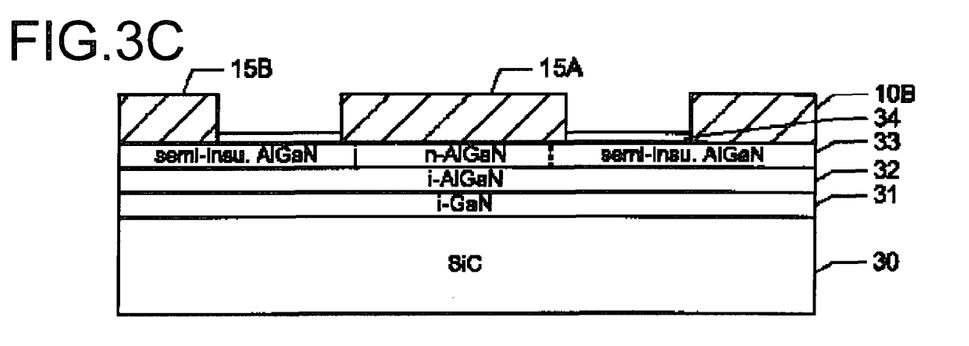

Hereinbelow, a description will be given of a procedure reaching the structure shown in FIG. 3C. A resist film is formed on the surface layer 34. Openings corresponding to the drain ohmic contact 10A (refer to FIGS. 2A and 2C), the drain coupling portion 10B, the source ohmic contact 15A, and the source coupling portion 15B are formed to the resist film. By using the resist film having the openings as a mask, the surface layer 34 is etched. The surface layer 34 containing GaN is etched by the RIE using $CL_2$.

In a state in which electron supply layer 33 is exposed to the bottom of the opening, a Ta film and an Al film are sequentially evaporated. The thicknesses of the Ta film and the AL film are 10 nm and 300 nm, respectively. The resist film is removed together with the Ta film and the Al film deposited thereon. Accordingly, the drain ohmic contact 10A having the two-layered structure having the Ta film and the Al film, the drain coupling portion 10B, the source ohmic contact 15A, and the source coupling portion 15B are formed.

Thermal processing is performed at a temperature of 600 C.°, and the drain ohmic contact 10A and the source ohmic contact 15A ohmically come into contact with the electron supply layer 33. Thus, the drain ohmic contact 10A and the source ohmic contact 15A are ohmically coupled to the intermediate layer 32 just therebelow.

Figure 3D:
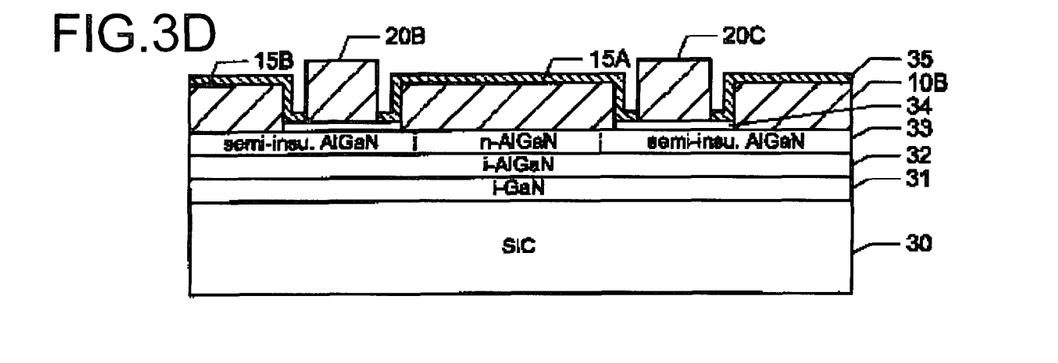
FIGS. 3D to 3F are cross-sectional views showing another step of manufacturing the field-effect transistor according to the first embodiment.

Hereinbelow, a description will be given of the procedure reaching the structure shown in FIG. 3D. The first protecting film 35 containing SiN is formed on the entire substrate with a thickness of 100 nm. The first protecting film 35 is formed with plasma excitation (PE) CVD. A resist film is formed on the first protecting film 35. On the resist film, openings for the gate finger 20A (refer to FIGS. 1 and 2A), the gate power supply wiring 20B, and the gate edge coupling portion 20C are formed. The first protecting film 35 is etched by using the resist film having the openings as a mask. The first protecting film 35 containing SiN is etched with the RIE using $SF_6$. Thus, the surface of the surface layer 34 is exposed.

An Ni film and an Au film are sequentially evaporated. The thicknesses of the Ni film and the Au film are 50 nm and 300 nm, respectively. After the evaporation, the resist film is removed together with the Ni film and the Au film deposited thereon. Thus, the gate 20 comprising the gate finger 20A, the gate power supply wiring 20B, and the gate edge coupling portion 20C is formed.

Figure 3E:
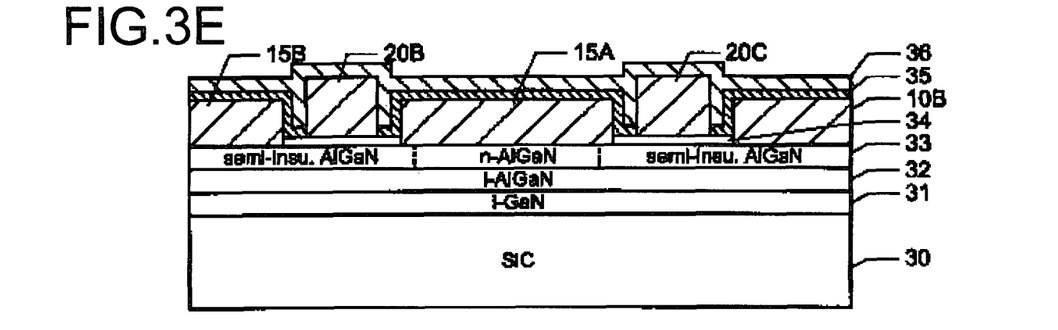

Referring to FIG. 3E, the second protecting film 36 containing SiN is formed by the PE-CVD with a thickness of 200 nm.

Figure 3F:
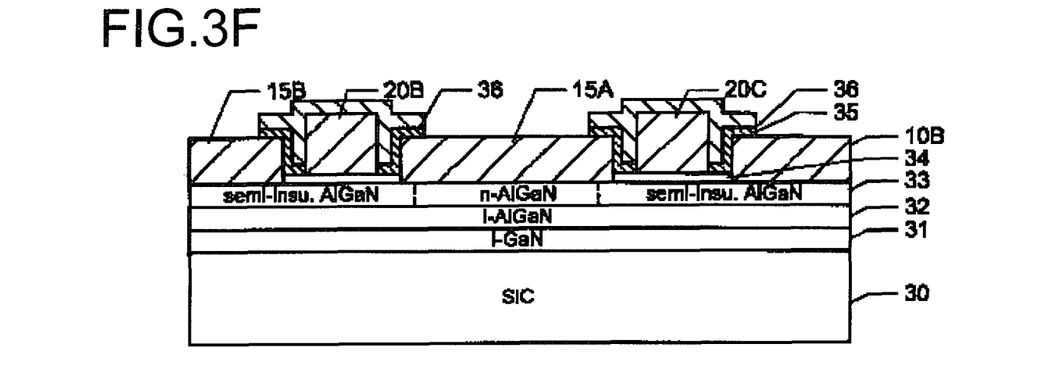

Referring to FIG. 3F, on the first protecting film 35 and the second protecting film 36, openings for exposing the top surfaces of the drain ohmic contact 10A (refer to FIGS. 2A and 2C), the drain coupling portion 10B, the source ohmic contact 15A, and the source coupling portion 15B are formed.

Figure 3G:
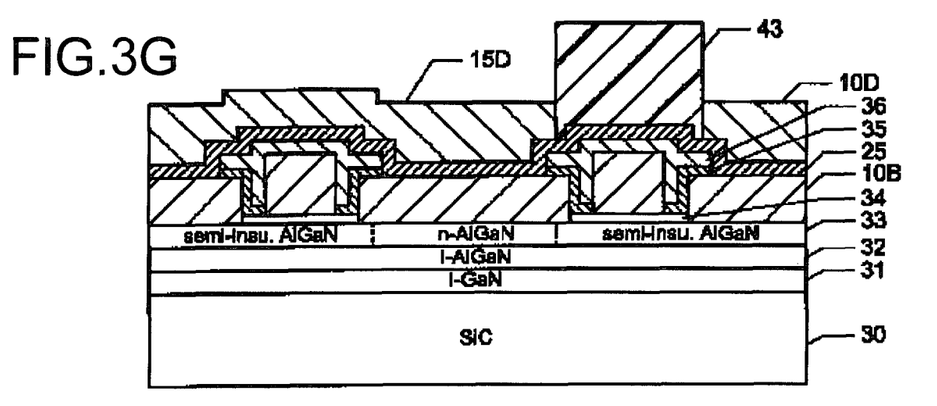
FIGS. 3G to 3I are cross-sectional views showing another step of manufacturing the field-effect transistor according to the first embodiment.

Referring to FIG. 3G, a seed layer 25 containing TiN with a thickness of 200 nm is formed onto the entire substrate by sputtering.

A resist film is formed on the seed layer 25. A resist pattern 43 remains by forming openings for the drain wiring 10D and the source wiring 15D. The seed layer 25 is used as an electrode to electrolly melting Au, thereby forming the drain wiring 10D and the source wiring 15D.

Figure 3H:
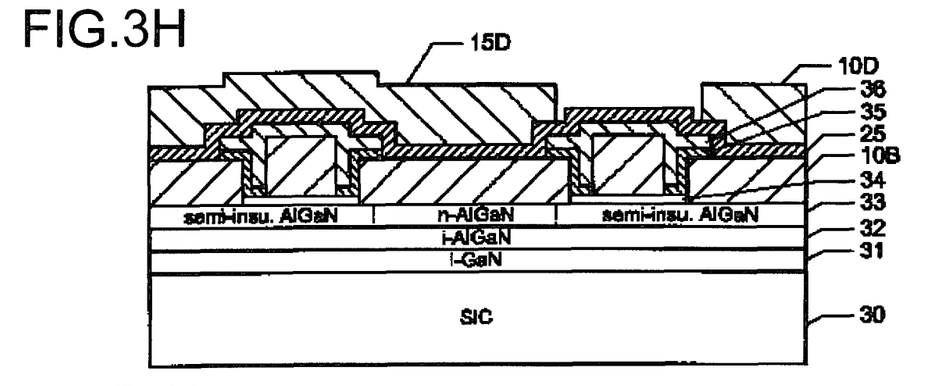
Figure 3I:
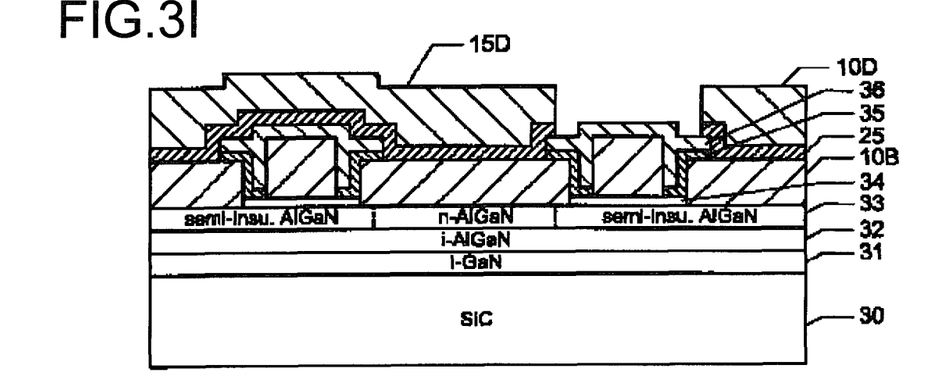

Referring to FIG. 3H, the resist pattern 43 is removed. Referring to FIG. 3I, the seed layer 25 remaining under the resist pattern 43 is removed by etching. Finally, a protecting film (not shown) containing SiN is formed to the entire substrate, and openings for exposing pad portions arranged to the drain wiring 10D, the source wiring 15D, and the gate power supply wiring 20B are formed to the protecting film.

On the field-effect transistor according to the first embodiment, even if one gate finger 20A is uncoupled, a gate voltage is applied to the drain coupling portion 10B side, not to the uncoupling portion, via the other gate finger 20A adjacent to the one gate finger 20A sandwiching the source ohmic contact 15A and the gate edge coupling portion 20C. Therefore, it is possible to suppress the deterioration in yield due to the uncoupling of gate finger.

As an example, it is assumed that a gate finger length is 0.4 mm, a gate finger interval is 30 μm, and a length of crystal default is linearly 0.6 μm. For the purpose of simplification, it is assumed that the crystal default is perpendicular to the gate finger. In this case, the probability for intersection between the crystal default and the gate finger is ⅕. That is, with the probability of 20%, an element default is caused by the uncoupling due to the intersection between the crystal default and the gate finger. On the other hand, even if the gate finger is uncoupled at one portion thereof in the field-effect transistor according to the first embodiment, the element default is not caused.

Since the gate edge coupling portion 20C is arranged so as not to be overlapped to the drain 10 in the field-effect transistor according to the first embodiment, it is possible to prevent the increase in parasitic capacitance between the gate and the drain.

Figure 4:
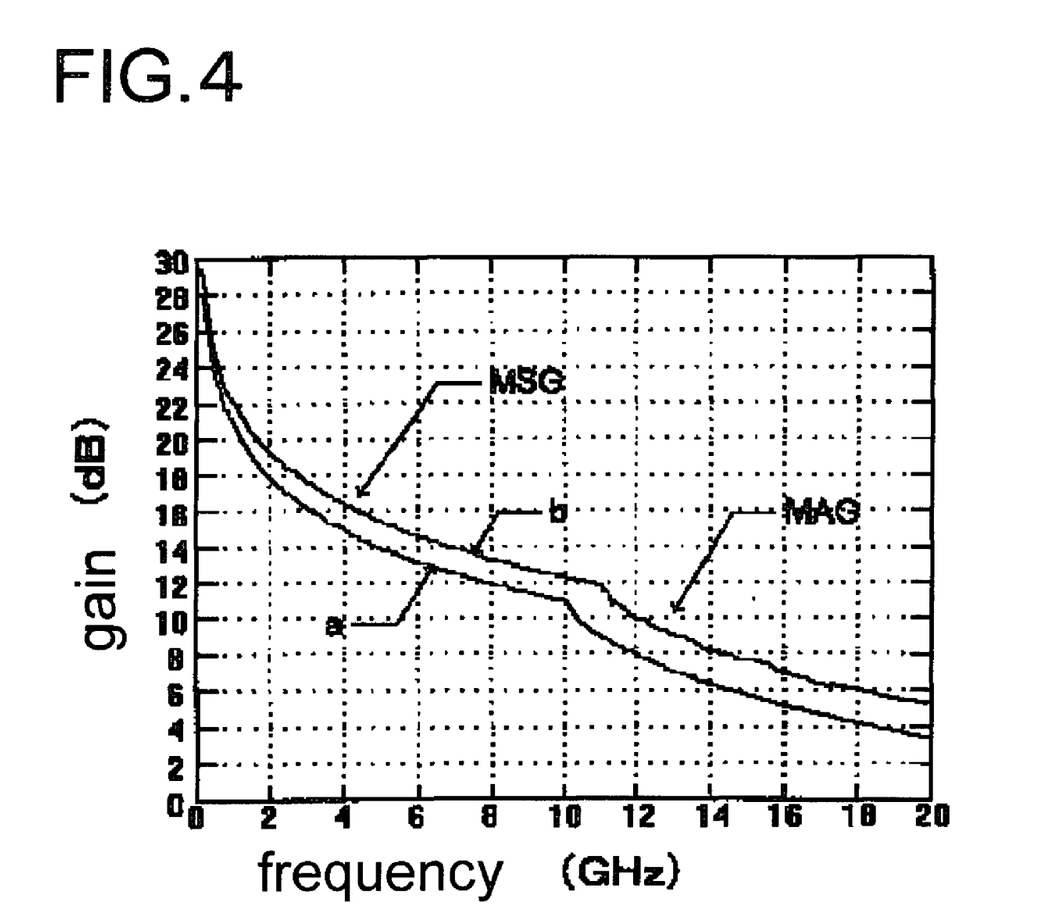
FIG. 4 is a graph showing high-frequency characteristics of the field-effect transistor according to the first embodiment, as compared with those of a conventional field-effect transistor.

FIG. 4 shows a calculation result of the frequency dependence of gain in the field-effect transistor according to the first embodiment. For comparison, a calculation result of the frequency dependence of gain in a field-effect transistor as an example shown in FIG. 10C is shown. A length of the gate edge coupling portion 20C is 30 μm, a width thereof is 10 μm, a width of the drain coupling portion 10B is 20 μm, and an interval between the gate edge coupling portion 20C and the drain coupling portion 10B is 5 μm in the field-effect transistor according to the first embodiment. In this case, with the structure according to the first embodiment, the parasitic capacitance between the gate and the drain is reduced by 20%, as compared with the case in which a gate edge coupling portion (second gate power supply line) 20Y shown in FIG. 10C intersects with the drain ohmic contact 10A.

Solid lines a and b in FIG. 4 show high-frequency characteristics of the field-effect transistors according to the comparison and the first embodiment. On a low-frequency side of a bending portion near a frequency ranging 10 to 11 GHz, the maximum stable gain (MSG) is represented and, on a high-frequency side thereof, the maximum available gain (MAG) is represented. With the structure according to the first embodiment, obviously, the gain is increased by 2 dB at a frequency band of 10 GHz. As mentioned above, it is confirmed that the high-frequency characteristics are improved.

Figure 5:
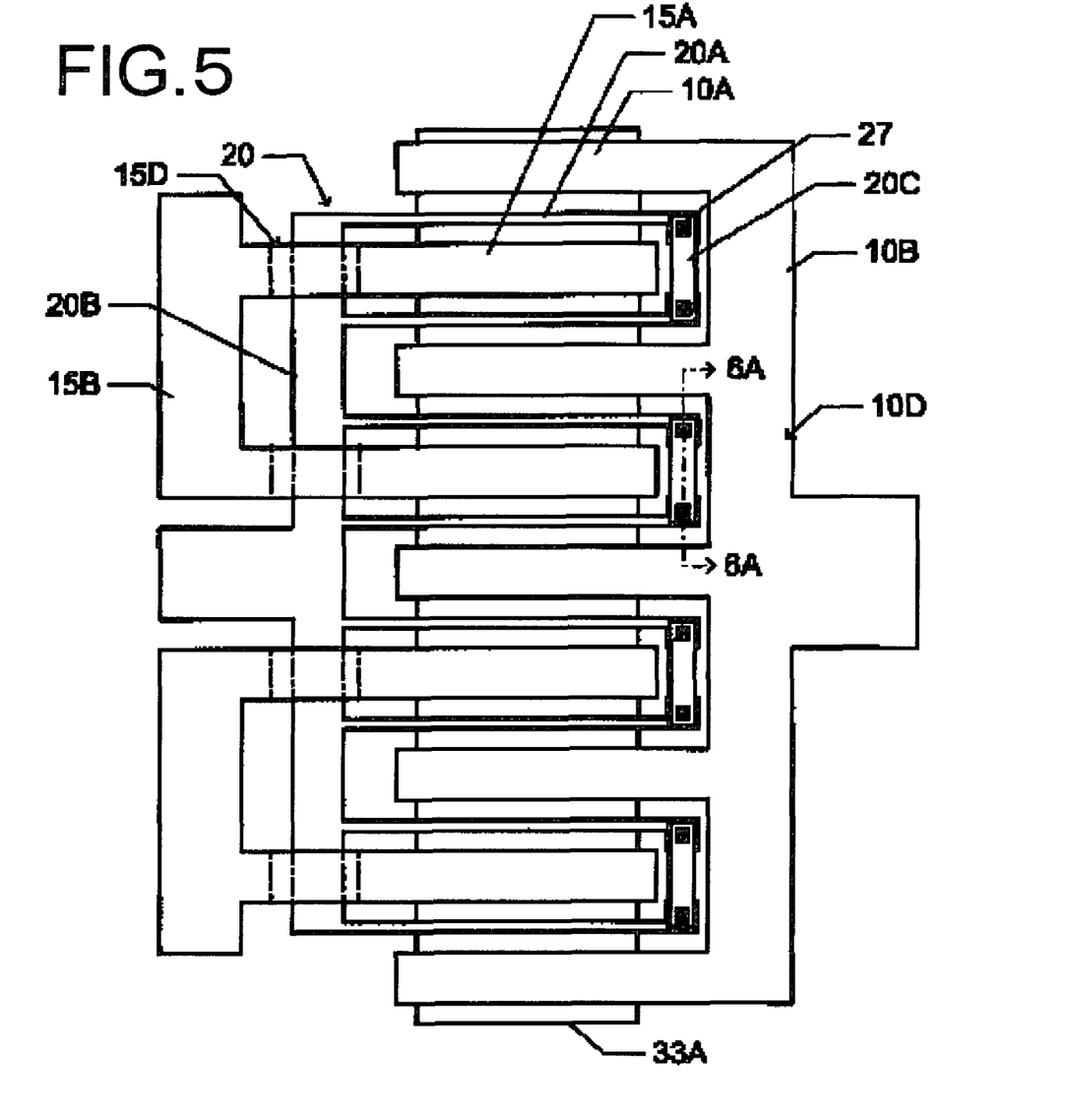
FIG. 5 is a plan view showing a field-effect transistor according to the second embodiment.

FIG. 5 shows a plan view of a field-effect transistor according to the second embodiment. According to the first embodiment, the gate edge coupling portion 20C contains the same conductive film as that of the gate finger 20A as shown in FIGS. 1 and 2C. However, according to the second embodiment, the gate edge coupling portion 20C is arranged above the gate finger 20A with a conductive film via an insulating film. A via-hole (opening) 27 is formed in/through the insulating film to couple the gate edge coupling portion 20C to the gate finger 20A. In order to easily position the via-hole 27, the edge of the gate finger 20A is thick. A squared pattern with a one-side length of 2 μm is arranged to the edge of the gate finger 20A. The planar shape of the via-hole 27 is squared with a 23one-side length of 1 μm.

Figure 6A:
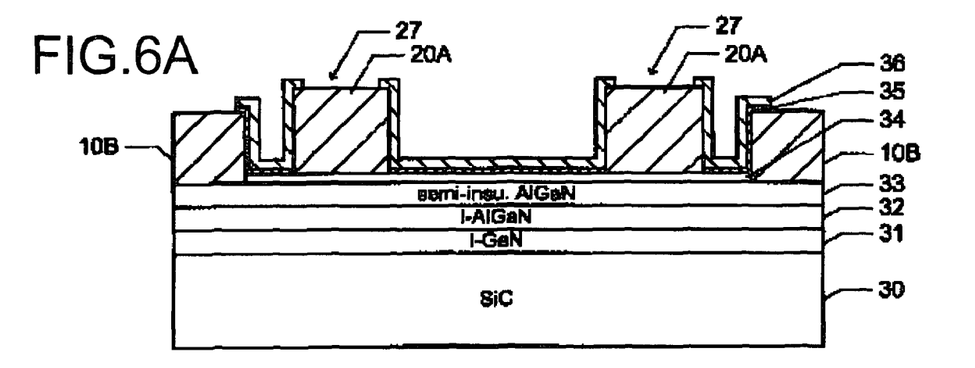
FIGS. 6A and 6B are cross-sectional views showing one step of manufacturing the field-effect transistor according to the second embodiment.
Figure 6B:
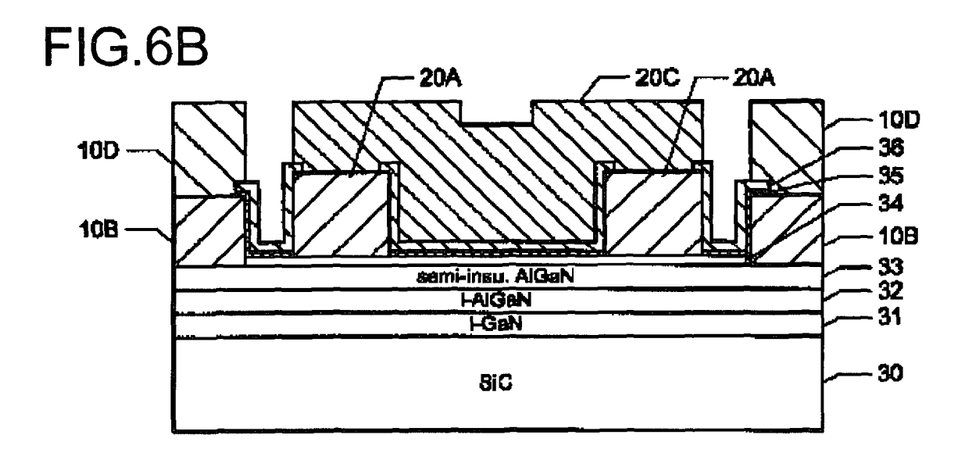

Referring to FIGS. 6A and 6C, a description will be given of a method for manufacturing the field-effect transistor according to the second embodiment. FIGS. 6A and 6B cross-sectional views of a one-dotted broken line 6A-6A in FIG. 5.

FIG. 6A shows the structure upon ending the procedure reaching the structure shown in FIG. 3F according to the first embodiment. According to the first embodiment, as shown in FIG. 2C, the gate edge coupling portion 20C is formed with the same conductive film as that of the gate finger 20A. According to the second embodiment, although the gate finger 20A is formed, the gate edge coupling portion is not formed. Further, although the entire surface of the gate edge coupling portion 20C is covered with the second protecting film 36 according to the first embodiment, the via-hole 27 as the opening for exposing the top surface of the gate finger 20A is formed to the second protecting film 36 according to the second embodiment.

Referring to FIG. 6B, the drain wiring 10D is formed on the drain coupling portion 10B. Further, the gate edge coupling portion 20C is formed on a pair of the gate fingers 20A and the second protecting film 36 therebetween. The gate edge coupling portion 20C is formed by patterning the same conductive film as that of the drain wiring 10D.

In the field-effect transistor according to the second embodiment, the first protecting film 35 and the second protecting film 36 containing a dielectric material are arranged between the surface layer 34 and the gate edge coupling portion 20C. Therefore, the parasitic capacitance between the gate finger 20A and the drain can be reduced.

Figure 7:
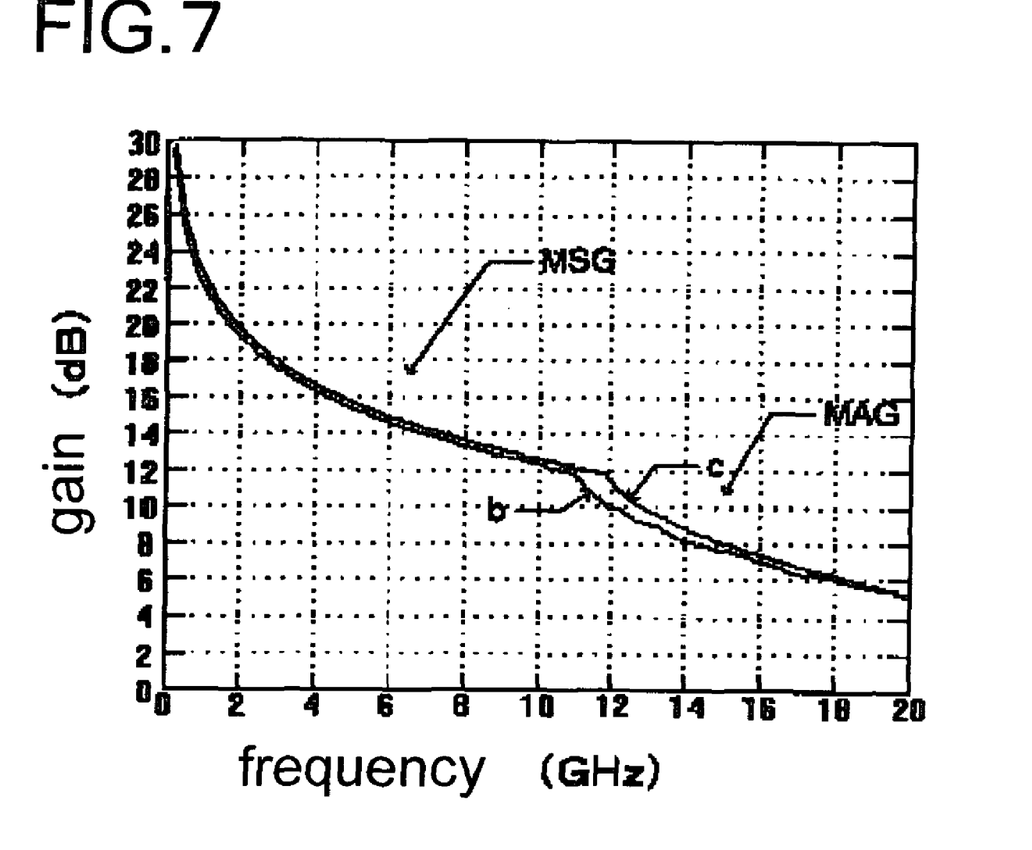
FIG. 7 is a graph showing high-frequency characteristics of the field-effect transistor according to the second embodiment, as compared with those of the field-effect transistor according to the first embodiment.

FIG. 7 shows, with a solid line c, the frequency characteristics of gain of the field-effect transistor according to the second embodiment. For a comparison, a solid line b represents the frequency characteristics of the gain of the field-effect transistor according to the first embodiment. Incidentally, the total thickness of the first and second protecting films 35 and 36 arranged below the gate edge coupling portion 20C in the field-effect transistor according to the second embodiment is 0.5 μm.

As compared with according to the first embodiment, obviously, the gain of the field-effect transistor according to the second embodiment is improved by 2 dB at a frequency band of 12 GHz. As mentioned above, the gate edge coupling portion 20C is arranged on the dielectric film, thereby improving the high-frequency characteristics.

Further, with the structure according to the second embodiment, upon forming the gate finger and the like by lift-off, another advantage is confirmed that resist residual cannot be caused. According to the first embodiment, as shown in FIG. 1, the gate pattern remaining after the lift-off becomes a figure closed with the gate finger 20A, the gate power supply wiring 20B, and the gate edge coupling portion 20C. Since a medical solution for lift-off cannot be penetrated into a region surrounded by the closed figure, the resist residual is easily caused. On the other hand, according to the second embodiment, since the gate pattern does not become the closed figure, the medical solution for lift-off is sufficiently penetrated, and the resist residual cannot be thus caused.

Next, a description will be given of a method for manufacturing a field-effect transistor according to the third embodiment with reference to FIGS. 8A to 8F. Plan views showing the field-effect transistor according to the third embodiment are the same as those according to the second embodiment shown in FIG. 5.

Figure 8A:
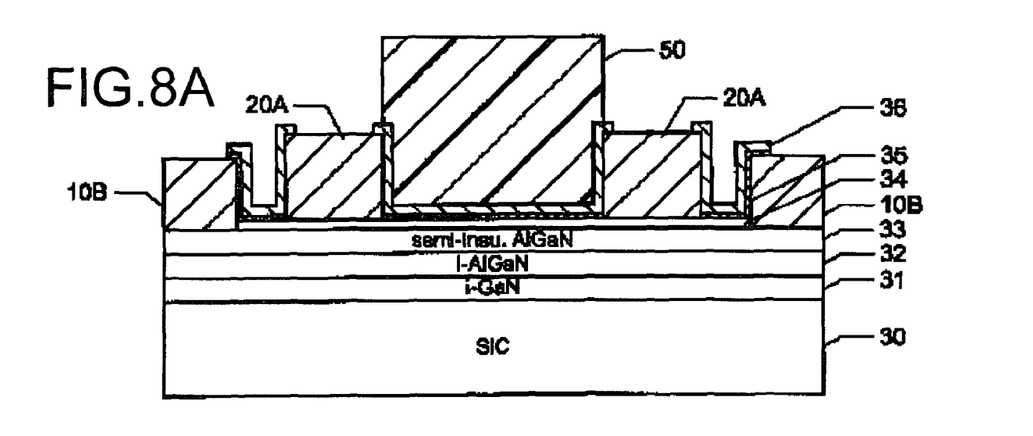
FIGS. 8A and 8B are cross-sectional views showing one step of manufacturing a field-effect transistor according to the third embodiment.
Figure 8B:
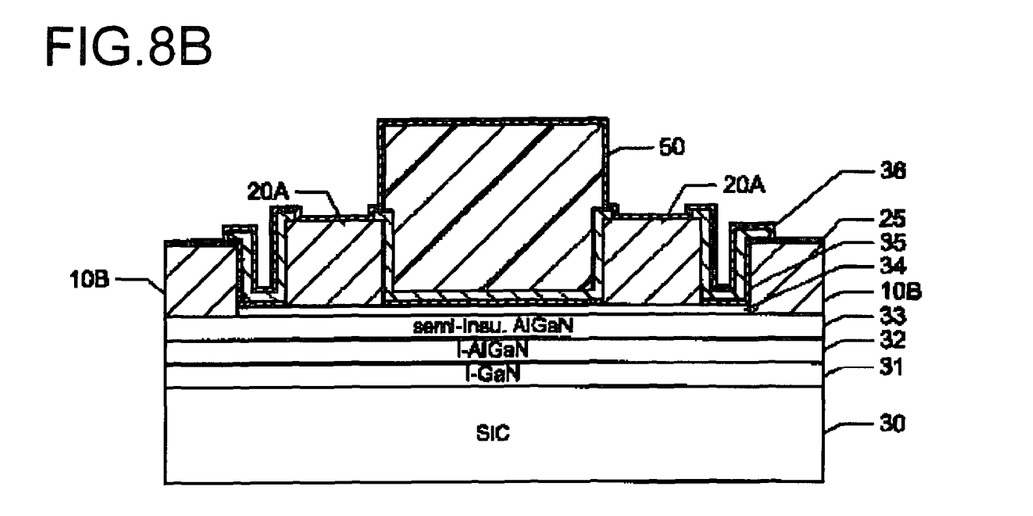

The procedure to the formation of the second protecting film 36 shown in FIG. 8A is the same as that according to the second embodiment shown in FIG. 6A. A first resist pattern 50 is formed on the second protecting film 36 between the edges of the two gate fingers 20A adjacent thereto. Referring to FIG. 8B, the seed layer 25 is formed to the entire substrate.

Figure 8C:
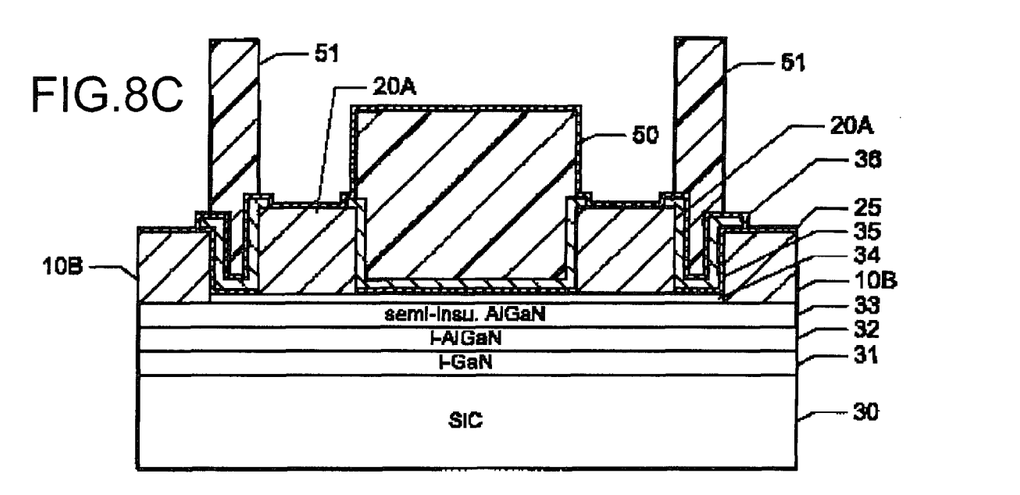
FIGS. 8C and 8D are cross-sectional views showing another step of manufacturing the field-effect transistor according to the third embodiment.

Referring to FIG. 8C, after forming the second resist film on the seed layer 25, openings for the drain wiring 10D, the source wiring 15D, and the gate edge coupling portion 20C are formed to the second resist film, thereby forming a second resist pattern 51.

Figure 8D:
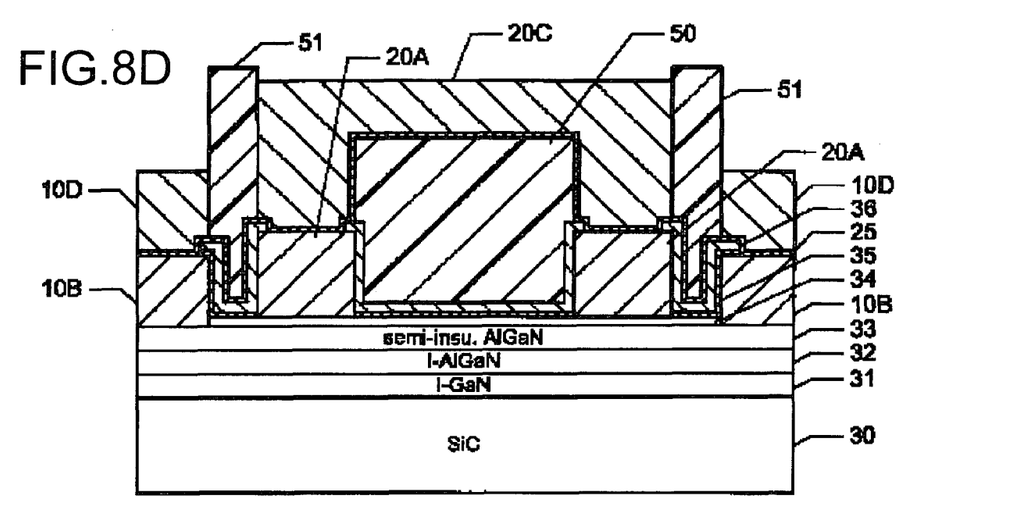

Referring to FIG. 8D, the seed layer 25 is used as an electrode to electrolly melting Au. Thus, the drain wiring 10D, the source wiring 15D, and the gate edge coupling portion 20C are formed. Thereafter, the first resist pattern 50 and the second resist pattern 51 are removed.

Figure 8E:
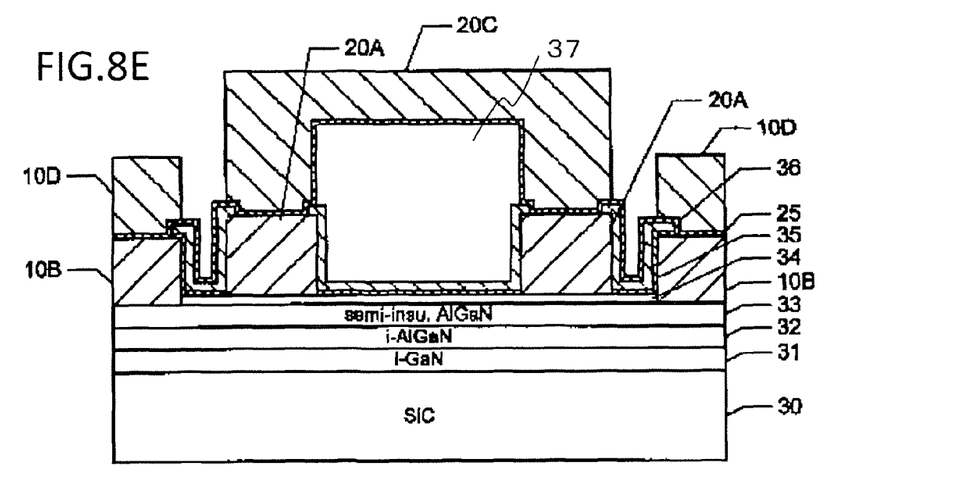
FIGS. 8E and 8F are cross-sectional views showing another step of manufacturing the field-effect transistor according to the third embodiment.
Figure 8F:
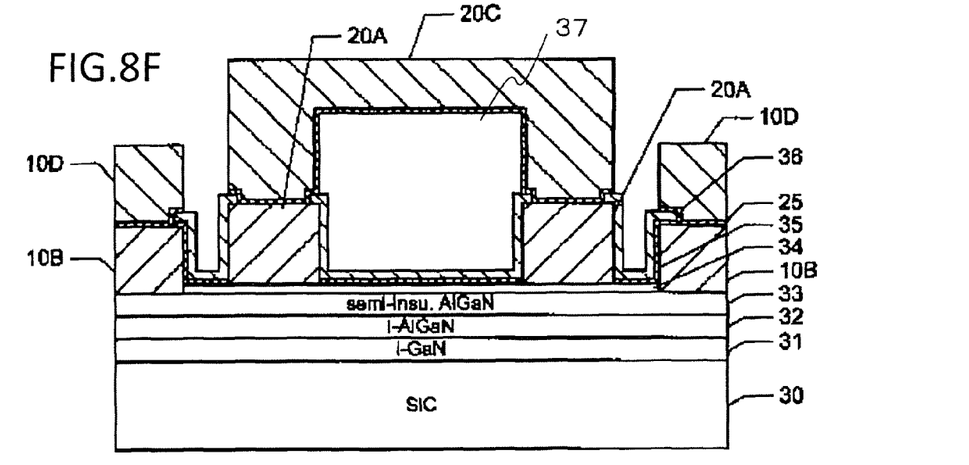

Referring to FIG. 8E, the gate edge coupling portion 20C supported to be hollow 37 remains. Referring to FIG. 8F, the exposed seed layer 25 is removed by etching.

Since the gate edge coupling portion 20C is supported to be hollow 37 according to the third embodiment, the parasitic capacitance between the gate and the drain can be reduced, as compared with that according to the second embodiment.

Figure 9:
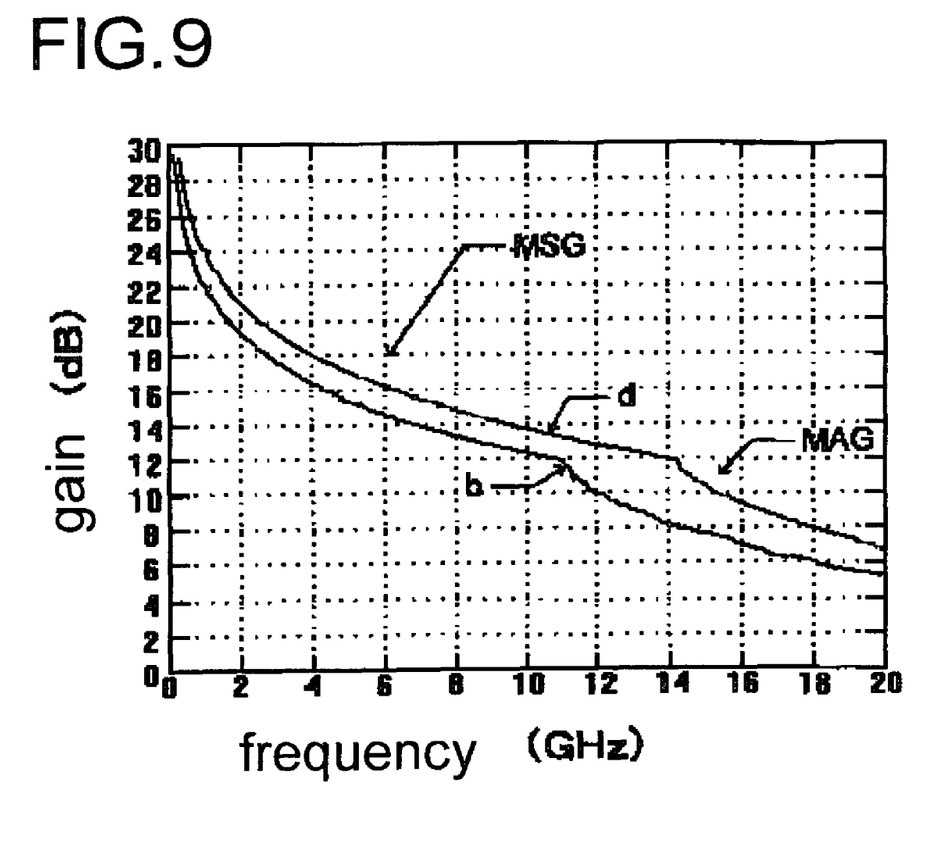
FIG. 9 is a graph showing high-frequency characteristics of the field-effect transistor according to the third embodiment, as compared with those of the field-effect transistor according to the first embodiment.

Referring to FIG. 9, a solid line d represents frequency characteristics of gain of the field-effect transistor according to the third embodiment. For a comparison, a solid line b represents frequency characteristics of gain of the field-effect transistor according to the first embodiment. The total thickness of the first protecting film 35 and the second protecting film 36 is 0.5 µm, and the height from the top surface of the second protecting film 36 to the bottom surface of the gate edge coupling portion 20C is 2 µm. Comparing FIG. 9 with FIG. 7, obviously, the high-frequency characteristics according to the third embodiment are more improved than those according to the second embodiment.

Although SiC is used for the bottom substrate 30 according to the first to third embodiments, another semiconductor substrate may be used. In particular, upon using the bottom substrate having the crystal default that causes the uncoupling of the gate finger, the gate structure according to the first to third embodiments is advantageous. Further, although GaN is used for the channel layer 31 and AlGan is used for the electron supply layer 33 according to the first to third embodiments, another semiconductor material may be used. A material with a band gap wider than that of the channel layer 31 is used for the electron supply layer 33. Incidentally, the function of the surface layer 34 reduces the influence from a surface trap caused by Al included in the electron supply layer 33, and the surface layer 34 can be omitted.

Further, the gate structure of the field-effect transistor according to the first to third embodiments can be applied to a transistor having a comb-shaped gate as the planar shape other than the structure according to the first to third embodiments.

The present invention is described according to the first to third embodiments. However, the present invention is not limited to this. It is obvious for a skilled person in the art that the present invention can be variously modified and combined.

The invention claimed is:

1. A field-effect transistor comprising:
   a semiconductor substrate having an active area and an element separating area surrounding the active area that are determined on a surface portion of the semiconductor substrate;
   a plurality of drain ohmic contacts arranged to intersect with the active area on the semiconductor substrate;
   a source ohmic contact arranged to intersect with the active area on the semiconductor substrate between two drain ohmic contacts adjacent thereto;
   a drain coupling portion arranged on the element separating area of the semiconductor substrate and couples ends of the drain ohmic contacts on the same side thereof;
   a gate having at least two gate fingers arranged to intersect with the active area on the semiconductor substrate of areas between a drain ohmic contact and the source ohmic contact, the two gate fingers sandwiching the source ohmic contact;
   a gate power supply line arranged on the element separating area of the semiconductor substrate, couples the two gate fingers at ends thereof opposite to the arrangement side of the drain coupling portion, and supplies a gate voltage to the gate fingers; and
   an insulating film being formed over the gate and the semiconductor substrate;
   a gate edge coupling portion on the insulating film, the gate edge coupling portion coupling the two gate fingers at an end thereof on the arrangement side of the drain coupling portion by conductive vias in the insulating film, the gate edge coupling portion being arranged so as not to intersect with the drain ohmic contact and the drain coupling portion, wherein the gate edge coupling is supported to be a hollow region.

2. The field-effect transistor according to claim 1, wherein the semiconductor substrate comprises:
   a bottom substrate containing SiC,
   a channel layer formed over the bottom substrate, and
   an electron supply layer formed over the channel layer, the electron supply layer providing an electron to the channel layer,
   wherein the drain ohmic contact and the source ohmic contact are ohmically coupled to the channel layer,
   wherein the gate controls the potential of the channel layer therebelow.

* * * * *